(12) United States Patent
Rajavel et al.

(10) Patent No.: US 7,582,536 B1
(45) Date of Patent: Sep. 1, 2009

(54) ELECTRONIC DEVICE WITH REDUCED INTERFACE CHARGE BETWEEN EPITAXIALLY GROWN LAYERS AND A METHOD FOR MAKING THE SAME

(75) Inventors: Rajesh D. Rajavel, Oak Park, CA (US);
Mary Y. Chen, Oak Park, CA (US);
Steven S. Bui, Simi Valley, CA (US);
David H. Chow, Newbury Park, CA (US); James Chingwei Li, Simi Valley, CA (US); Mehran Mokhtari, Thousand Oaks, CA (US); Marko Sokolich, Los Angeles, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 12/191,482

(22) Filed: Aug. 14, 2008

Related U.S. Application Data (62) Division of application No. 11/713,070, filed on Feb. 28, 2007.

(60) Provisional application No. 60/777,937, filed on Feb. 28, 2006.

(51) Int. Cl.
*H01L 21/331* (2006.01)
*H01L 21/8222* (2006.01)

(52) U.S. Cl. .................. 438/312; 438/341; 438/357; 438/906; 257/197; 257/592; 257/E27.053; 257/E21.108; 257/E21.226

(58) Field of Classification Search ............... 438/312, 438/341, 357, 906; 257/197, 592, E27.053, 257/E21.108, E21.226
See application file for complete search history.

(56) References Cited

U.S. PATENT DOCUMENTS 7,022,578 B2 * 4/2006 Verma et al. ............ 438/312

OTHER PUBLICATIONS

Chandrasekhar, S., et al., "A 10 Gbit/s OEIC Photoreceiver Using InP/InGaAs Heterojunction Bipolar Transistors," Electronics Letters, 1992, Vo. 28, N.5.

Dong,Y., et al.,"$C_{bc}$ Reduction in InP Heterojunction Bipolar Transistor with Selectivity Implanted Collector Pedestal," Proceedings of 2004 DRC, pp. 67-68.

Dong,Y., et al.,"InP Heterojunction bipolar transistor with a selectively implanted collector," Solid State Electronics 48 (2004) pp. 1699-1702.

(Continued)

*Primary Examiner*—Tu-Tu V Ho
(74) *Attorney, Agent, or Firm*—Ladas & Parry (57) ABSTRACT

An electronic device contains a substrate, a sub-collector supported by the substrate, an un-doped layer having a selectively implanted buried sub-collector and supported by the sub-collector, an As-based nucleation layer partially supported by the un-doped layer, a collector layer supported by the As-based nucleation layer, a base layer supported by the collector layer, an emitter layer and a base contact supported by the base layer, an emitter cap layer supported by the emitter layer, an emitter contact supported by the emitter cap layer, and a collector contact supported by the sub-collector. A method provides for selecting a first InP layer, forming an As-based nucleation layer on the first InP layer, and epitaxially growing a second InP layer on the As-based nucleation layer.

14 Claims, 6 Drawing Sheets

OTHER PUBLICATIONS

Ingrey, S., "III-V surface processing," J. Vac. Sci. Technol. A10, 1992, pp. 829-836.

Gallet et al., "Protection of InP epi-redy wafers by controlled oxide growth," Third International Conference Indium Phosphide and Related Materials, Cat. No. 91, CH2950-4, IEEE 1991, pp. 85-88.

Hafez, M.A., et al., "Atomic Hydrogen cleaning of InP(001): electron yield and Surface morphology of negative electron affinity activated surfaces," J. Appl. Phys. 40, p. 1874 (2001).

Kawal, N., et al., Carrier compensation at interfaces formed by MBE by N.Kawal, C.E.C Wood and L.F. Eastman, J. Appl.Phys. 53,1982, pp. 6208-6213.

Kiziloglu, K., et al., "InP-Based Hiq Sensitivity pin/HEMT/HBT Monolithic integrated Optoelectronic Receiver," IPRM 1998,pp. 255-257.

Kopf., R.E., et al., "Towards Planar Processing of InP DHBTs," Lucent Technologies, 2003 IPRM Sant Barbara, Ca, May 12-16, 2003.

Lee, T., et al., "Ch. 7, High Speed Photonic Devices of Modern Semiconductor Device Phsyics," Fig. 36, pp. 453.

Losurdo, P., et al., Study of the H2 remote plasma cleaning of InP substrate for epitaxial growth,: J. Vac. Sci. Technol. B14, p. 691 (1992).

Matsuoka, Y., et al.,"Ultrahigh-Speed InP/InGaAs DhPTs for OEM-MICs," IEEE Tran om Microwave Theory and Techniques, vol. 49, No. 10, Oct. 2001, pp. 1921-1925.

Matsuoka, Y., et al., "Novel InP/InGaAs double-Heterojunction bipolar Transistors suitable for High-speed IC's and OEIC's," pp. 555-558, Downloaded from IEEE Xplore, 1994.

Muranaka, T., et al., "Characterization and optimization of atomic hydrogen cleaning of InP surface for selective MBE of InGaAs quantum structure arrays," J. Appl. Phys. 40,p. 1874 (2001).

Sugaya, T., et al., "Low-Temperature Cleaning of GaAs Substrate by Atomic Irradiation," Japanese Journal of applied Physics, vol. 30, No. 3A, Mar. 1991, pp. L402-L404.

Walden, B., "A Review of Recent Progres in InP-Based Optoelectronic Integrated Circuit Receiver Front Ends," GaAs IC Symposium 1996, pp. 255-257.

Wang, H., et al., "A Monolithic 24-Ghz Frequency Source Using InP-Based HEMT-HBT Integration technology," 1997 Radio/frequency integrated Circuits Symposium, pp. 79-81.

* cited by examiner

ELECTRONIC DEVICE WITH REDUCED INTERFACE CHARGE BETWEEN EPITAXIALLY GROWN LAYERS AND A METHOD FOR MAKING THE SAME

This application is a division of application Ser. No. 11/713,070, filed Feb. 28, 2007, which claims benefit of 60/777,937, filed Feb. 28, 2006.

STATEMENT REGARDING FEDERALLY SPONSORED RESEARCH OR DEVELOPMENT

A portion of the present invention was made with support from the United States Government under contract number TFAST AFRL F33615-02-C-11268 awarded by the Office of Air force Research Lab. The United States Government may have certain rights in some of the inventions.

CROSS REFERENCE TO RELATED PUBLICATIONS

This application is related to "A Submicrometer 252 GHz $f_t$ and 283 GHz $f_{max}$ InP DHBT With Reduced $C_{BC}$ Using Selectively Implanted Birried Subcollector (SIBS)," by James C. Li, et al. (IEEE Electron Device Letters, Vol. 26, No. 3, March 2005) which is incorporated herein by reference in its entirety.

FIELD

The present disclosure relates to electronic devices. More particularly, the present disclosure relates to electronic devices which benefit from reduced interface charge between epitaxially grown layers.

BACKGROUND

Vertical scaling of the epitaxial structure and lithographic lateral scaling are the traditional approaches used to improve transistor performance. Selective doping of the collector region is yet another approach used to improve the speed of operation of a transistor. For example, by minimizing the area of the extrinsic collector, through selective doping by ion implantation, we can realize reduced base collector capacitance ($C_{bc}$) and thus reduce the parasitic capacitance of a transistor. For this approach to be effective, the region surrounding the selectively doped region has to be resistive. This requires the elimination of charge at the interfaces of the re-grown layers and materials that constitute the transistors after implant for selective doping.

The primary objective of the work published in the literature up to now has been using in-situ atomic hydrogen cleaning at low temperature for the removal of oxygen and carbon between epitaxially grown layers. However, no information has been published on the preparation of InP surfaces for the purpose of reducing interface charge using in-situ atomic hydrogen cleaning. Additionally, the reason for the origin of charge at the InP epilayer/InP substrate is also not known. Novel methods for reducing interface charge between epitaxial layers grown before and after ion implantation for high-performance electronic devices that capitalize on the benefits of selective doping for reducing parasitics are disclosed in the present disclosure.

Among the variety of device combinations that have been used in Optoelectronic Integrated Circuit (OEIC) fabrication the simplest is an InP Single Heterojunction Bipolar Transistor (SHBT) approach in which the base-collector (B-C) junction is used as the absorption region of the p-i-n photodiode (PD) However, a pin photo diode and a SHBT in the OEIC disclosed in prior art are not capable of high performance for Ultra wideband applications because a photo absorbing layer of a pin photo diode and a collector layer of a SHBT typically have same doping and thickness.

An OEIC according to the present disclosure is capable of high performance and may be used in Ultra wideband applications.

PRIOR ART

The prior art consists of two main categories: (1) preparation of InP surfaces for epitaxial growth, and (2) heterojunction bipolar transistors (HBTs) and Optoelectronic Integrated Circuits.

Example of prior art directed to preparation of InP surfaces for epitaxial growth include:

1. "III-V surface processing", S. Ingrey (J. Vac. Sci. Technol. A10, 1992 pp 829-836).
2. "Protection of InP epi-redy wafers by controlled oxide growth", by Gallet et al. (Third International Conference. Indium Phosphide and Related Materials (Cat. No. 91CH2950-4). IEEE. 1991, pp. 85-8. New York, N.Y., USA).
3. "Carrier compensation at interfaces formed by MBE by N. Kawal, C. E. C. Wood and L. F. Eastman (J. Appl. Phys. 53, 1982, pp 6208-6213).
4. "Towards Planar Processing of InP DHBTs", by R. E. Kopf et. al. of Lucent Technologies, (Presented at 2003 IPRM, Santa Barbara, Calif. May 12-16, 2003).
5. "$C_{bc}$ Reduction in InP Heterojunction Bipolar Transistor with Selectively Implanted Collector Pedestal", by Yingda Dong et al, in Proceedings of 2004 DRC, pp. 67-68.
6. "Study of the H2 remote plasma cleaning of InP substrate for epitaxial growth", M. Losurdo, P. Capezzuto, and G. Bruno, J. Vac. Sci. Technol. B14, p. 691 (1992).
7. "Atomic Hydrogen cleaning of InP(001): electron yield and surface morphology of negative electron affinity activated surfaces,", M. A. Hafez, M. E. Elsayed-Ali, J. Appl. Phys. 90 p. 1256 (2002).
8. "Characterization and optimization of atomic hydrogen cleaning of InP surface for selective MBE of InGaAs quantum structure arrays,", T. Muranaka, C. Jiang, A. Ito, and H. Hasegawa, Jpn. J. Appl. Phys. 40, p. 1874 (2001).
9. T. Sugaya et al., Jpn. J. Appl. Phys. 30 L402 (1991).

Example of prior art directed to heterojunction bipolar transistors and Optoelectronic Integrated circuits include:

1. "A Review of Recent Progress in InP-Based Optoelectronic Integrated Circuit Receiver Front-Ends", by B. Walden, (GaAs IC Symposium 1996, pp. 255-257).
2. "InP-Based High Sensitivity pin/HEMT/HBT Monolithic Integrated Optoelectronic Receiver" by Kürsad Kiziloglu et al, (IPRM 1998, pp. 443-446).
3. "Novel InP/InGaAs Double-heterojunction Bipolar transistors Suitable for High-Speed IC's and OEIC's" by Y. Matsuoka et al, (IPRM 1994, pp. 555-558).
4. "Ultrahigh-Speed InP/InGaAs DHPTs for OEMMICs", by H. Kamitsuna et al, (IEEE Tran on Microwave Theory and Techniques, vol. 49, No. 10, October 2001, pp. 1921-1925).
5. Chapter 7, High-Speed Photonic Devices of Modern Semiconductor Device Physics by T. Lee and S. Chandrasekhar, edited by S. M. Sze, FIG. 36, pp. 453.
6. "A 10 Gbit/s OEIC Photoreceiver Using InP/InGaAs Heterojunction Bipolar Transistors", by S. Chandrasekhar et al, Electronics Letters, 1992, Vol. 28, No. 5, pp. 466-468.

7. "A Monolithic 24-GHz Frequency Source Using InP-Based HEMT-HBT Integration technology", by H. Wang et al, 1997 IEEE Radio frequency Integrated Circuits Symposium, pp. 79-81.
8. "InP heterohunction bipolar transistor with a selectively implanted collector", by Y Dong et al, Solid-State Electronics 48 (2004) 1699-1702.

In the following description, like reference numbers are used to identify like elements. Furthermore, the drawings are intended to illustrate major features of exemplary embodiments in a diagrammatic manner. The drawings are not intended to depict every feature of every implementation nor relative dimensions of the depicted elements, and are not drawn to scale.

DETAILED DESCRIPTION

Ways of Reducing Interface Charge Between Epitaxially Grown Layers

The capability to grow highly resistive layers, like for example InP layers, by Molecular Beam Epitaxy (MBE) is preferred for the fabrication of high performance transistors that utilize selectively implanted sub-collector regions.

Nominally undoped InP epilayers deposited on InP substrates by MBE have electron densities ranging from $2 \times 10^{11}$ cm$^{-2}$ to $2 \times 10^{12}$ cm$^{-2}$ and exhibit low sheet resistance (~1-10× $10^3$ ohms/square). The MBE growth interface was found to be the origin of the electron charge. The following novel methods may be used to reduce interface charge in MBE-grown epilayers.

In one exemplary embodiment, an interface charge between the epitaxially grown epilayers may be reduced by growing an As-based nucleation layer of thickness of about 10 Å to 1000 Å, such as for example InGaAlAs, InGaAs, IrAlAs, InGaAsP or GaAlAs, between the MBE-grown epilayers. This exemplary embodiment enables the growth, for example, of highly resistive InP epilayers by MBE with sheet charge densities as low as $3 \times 10^9$ cm$^{-2}$ ($R_s$~$2 \times 10^6$ ohms/square). See FIGS. 1a-c.

Figure 1A:
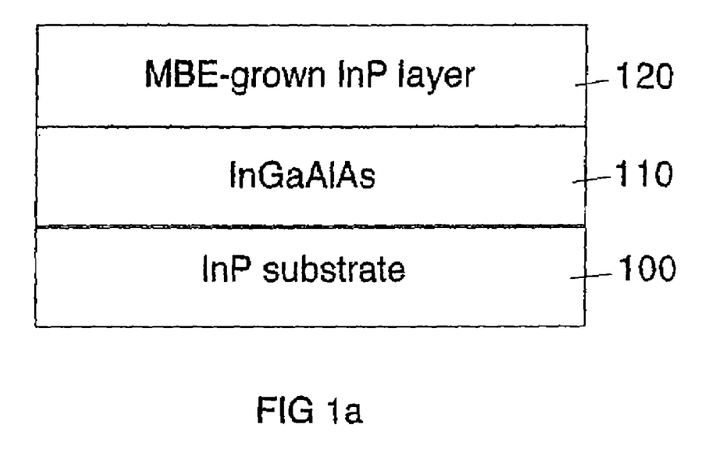
FIGS. 1a-c and 2 depict exemplary embodiments of an As-based nucleation layer being formed between epitaxially formed layers according to the present disclosure.

By growing an InGaAlAs layer 110 between an InP substrate 100 and an InP layer 120, as shown in FIG. 1a, a sheet charge level of 3.25E9 cm$^{-2}$ and a sheet resistance of 2.94E6 Ω/square between the InP substrate 100 and InP layer 120 was obtained. The sheet resistance value was determined from Hall measurements.

Figure 1B:
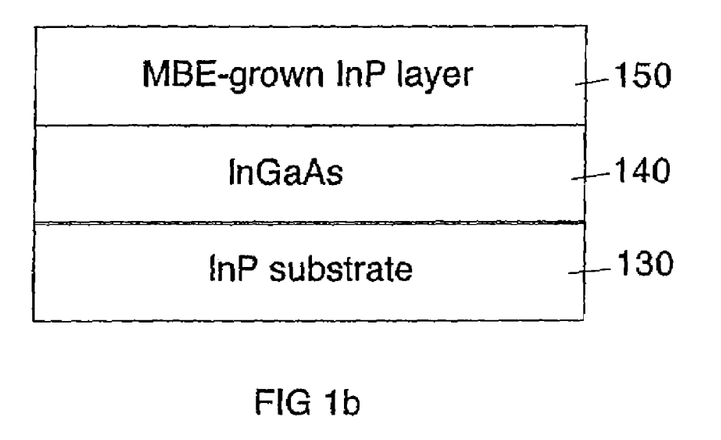

By growing an InGaAs layer 140 between an InP substrate 130 and an InP layer 150, as shown in FIG. 1b, a sheet charge level of 7.21E9 cm$^{-2}$ and a sheet resistance of 8.17E5 Ω/square between the InP substrate 130 and InP layer 150 was obtained. The sheet resistance value was determined from Hall measurements.

Figure 1C:
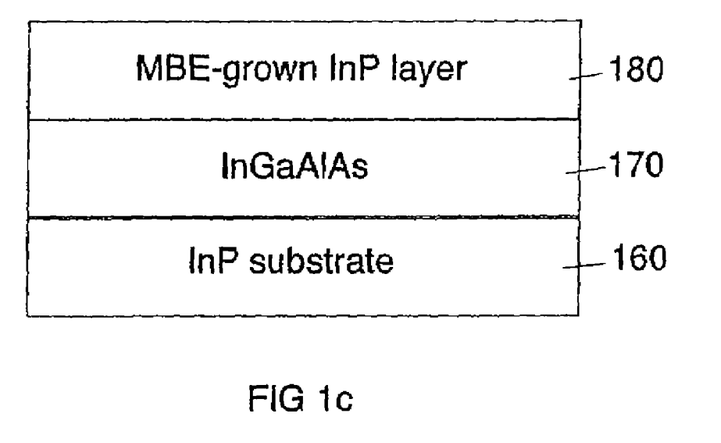

By growing an InGaAlAs layer 170 between an Metalorganic Chemical Vapor Deposition (MOCVD) annealed InP substrate 160 and an InP layer 180, as shown in FIG. 1c, a sheet charge level of 9.52E9 cm$^{-2}$ and a sheet resistance of 6.26E5 Ω/square between the MOCVD-annealed InP substrate 160 and InP layer 180 was obtained. The MOCVD-annealed InP substrate 160 was intended to mimic an implant activation anneal performed on DHBTs that have a selectively implanted sub-collector. The sheet resistance value was determined from Hall measurements.

Figure 2:
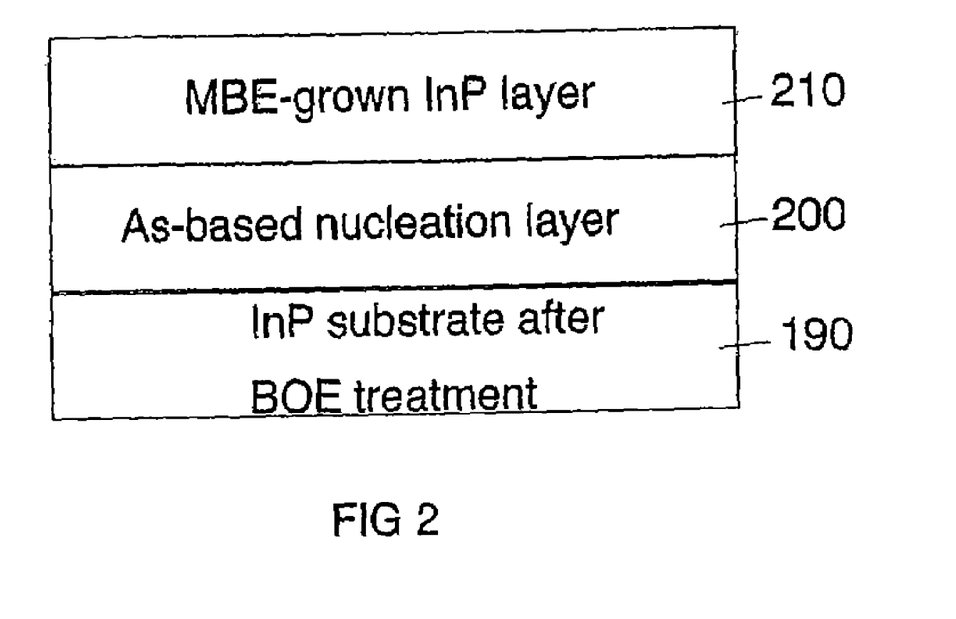

As shown in the FIG. 2, in another exemplary embodiment, an interface charge between the MBE-grown epilayers may also be reduced by performing an ex-situ cleaning with a hydrogen fluoride (HF) based solution, such as, for example, Buffer Oxide Etch (BOE), on an InP substrate 190 and growing an As-based nucleation layer 200, of thickness of about 10 Å to 1000 Å, such as for example InGaAlAs, InGaAs, InAlAs, InGaAsP, GaAlAs, InAs, GaAs or AlAs, between the ex-situ HF treated InP substrate 190 and an InP epilayer 210.

By growing the As-based nucleation layer 200 between the ex-situ HF treated InP substrate 190 and an InP layer 210, as shown in FIG. 2, a sheet charge level of 8.01E9 cm$^2$ and a sheet resistance of 7.25E5 Ω/square between the ex-situ HF treated InP substrate 190 and an InP layer 210 was obtained. The sheet resistance value was determined from Hall measurements.

Figure 3:
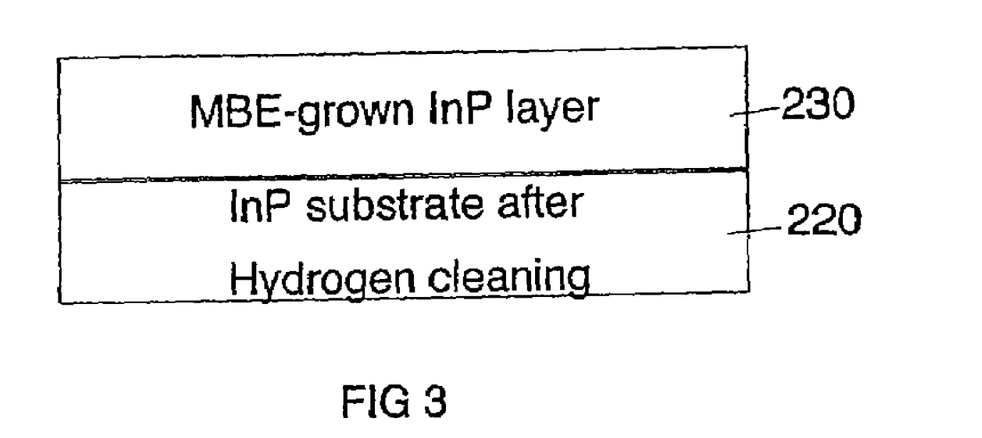
FIG. 3 depicts an exemplary embodiment of epitaxially grown layers after an Atomic Hydrogen cleaning according to the present disclosure.

As shown in the FIG. 3, in another exemplary embodiment, an interface charge between the MBE-grown epilayers may also be reduced by performing an in-situ cleaning with reactive hydrogen like, for example, atomic hydrogen, of an InP substrate 220 prior to forming an InP layer 230 on the InP substrate 220. The reactive hydrogen or other reactive atomic hydrogen species may be created through thermal decomposition, electron bombardment or radio frequency (RF) plasma assisted decomposition of hydrogen.

Figure 12:
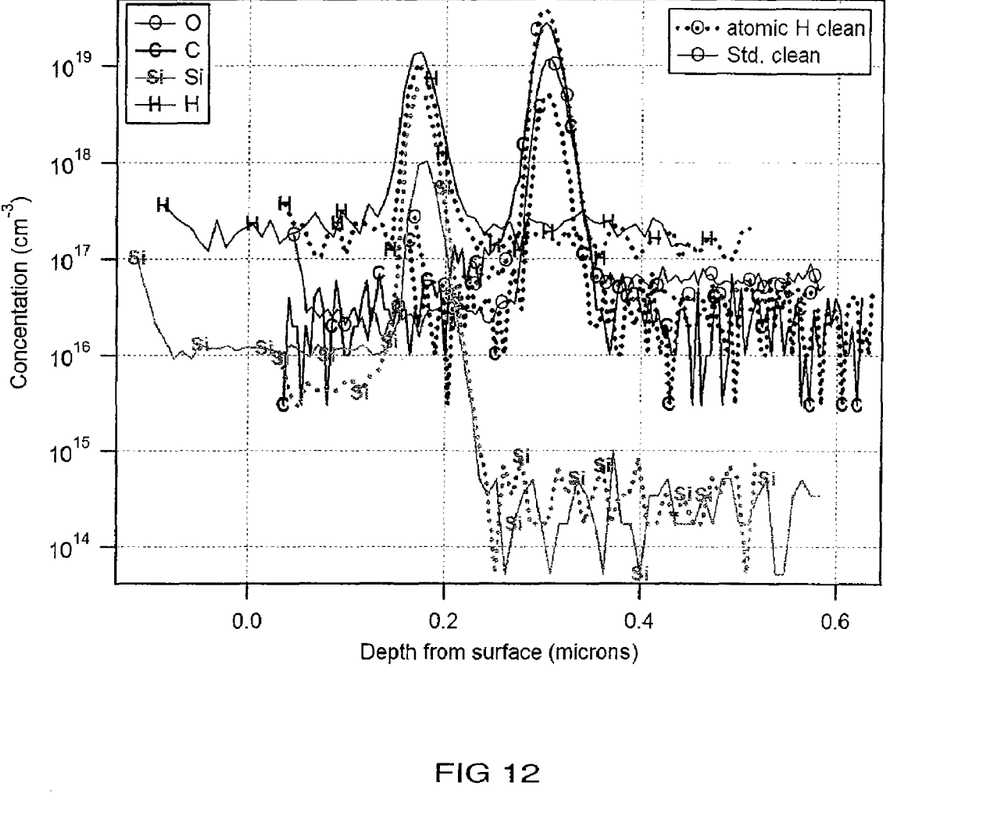
FIG. 12 depicts a secondary ion mass spectroscopy (SIMS) data for InP epilayers grown using conventional heat cleaning procedure (solid lines) and atomic hydrogen cleaning (dotted line).

In order to investigate the origin of the interface charge, a secondary ion mass spectrometry (SIMS) analysis was performed on InP epilayers/substrates that were subject to the atomic hydrogen cleaning as well as the conventional thermal cleaning processes. The results are shown in FIG. 12 and Table 1. As shown in FIG. 12, the x-axis has been staggered for Si and H, with respect to the profiles for C and O. Increased concentration of impurities marks the interface between the InP epilayer and the InP substrate. Further as shown in FIG. 12, the level of interface carbon (C) for the atomic hydrogen cleaned sample is about 5× lower than the sample subject to the standard heat cleaning. On the other hand the levels of interface silicon (Si) and oxygen (O) are elevated for the atomic hydrogen cleaned sample. As shown in Table 1, by increasing the hydrogen flow and raising the temperature the in-situ atomic hydrogen cleaned sample may exhibits a sheet resistance of above 180,000 ohms/square which is about a factor of 10 higher than the sample cleaned by the conventional thermal cleaning method. Based on the data shown in FIG. 12 and Table 1 the conventional thermal cleaning methods are not enough to realize reduction in the interface charge between epitaxially grown layers.

By cleaning the InP substrate 220 with hydrogen prior to forming the InP epitaxial layer 230, as shown in FIG. 3, a sheet charge level of $2 \times 10^9$ cm$^{-2}$ and a sheet resistance of $3 \times 10^6$ Ω/square between the InP substrate 220 and the InP layer 230 was obtained.

Figure 4:
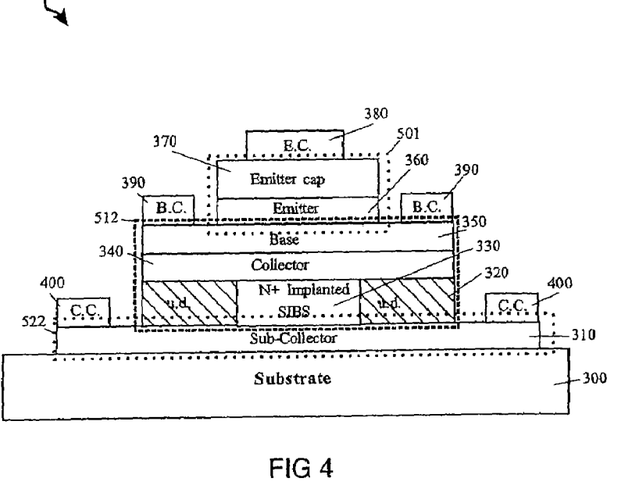
FIG. 4 depicts a cross sectional view of a Double Heterojunction bipolar transistor (DHBT) with a Selectively Implanted Buried Sub-collector (SIBS) according to the present disclosure.

The following Table I provides exemplary atomic hydrogen cleaning procedures and their impact on the sheet resistance.

capacitance. The DHBT 30 has a thin intrinsic collector 340 located above SIBS 330 for reducing $t_c$ and a thicker extrinsic collector 340 together with the un-doped layers 320 for reducing $C_{bcx}$ at the same time. The DHBT 30 is able to decouple intrinsic and extrinsic base-collector capacitance and optimize the collector to yield higher $f_t$ at higher Ic, and $f_{max}$, while increasing device linearity and dynamic range. Further, since no lateral undercut is needed for reduction of external $C_{bc}$ in the DHBT 30 with SIBS 330, the DHBT 30 also provides thermal advantage. These characteristics improve gain, stability and noise-properties of critical high frequency circuits.

TABLE 1

| Run # | H2 flow (sccm) | T H$_2$cell (° C.) | Fila. Current (amps) | Tsubstrate for H$_2$ soak (° C.) | [H] soak time (min.) | Substrate heat clean temperature (° C.) | Heat clean duration (min.) | InP epi thickness (Å) | Epilayer sheet resistance (Ω/square) |
|---|---|---|---|---|---|---|---|---|---|
| I-3748 | 2.5 | 1020 | 8.0 | 230 | 10 | 445 | 14 | 2600 | 23748 |
| I-3749 | 2.5 | 1020 | 8.0 | 230 | 18 | 445 | 15 | 3400 | 9478 |
| I-3750 | 2.5 | 1019 | 8.0 | 218 | 15 | 440 | 14 | 1500 | 24393 |
| I-3751 | 2.5 | 1014 | 8.0 | 438 | 25 | 440 | 15 | 1600 | 8698 |
| I-3752 | 2.5 | 1020 | 8.0 | 275 | 20 | 465 | 15 | 1500 | 16812 |
| I-3821 | 2.5 | 1021 | 8.0 | 278 | 25 | 487 | 15 | 1500 | 33767 |
| I-3824 | 5.0 | 1020 | 8.0 | 275 | 25 | 480 | 15 | 1500 | 50000 |
| I-3826 | 5.0 | 1125 | 8.75 | 50 to 276 | 15 + 25 | 480 | 15 | 1500 | 180000 |
| I-4043 | 5.0 | 1117 | 8.75 | 50 to 276 | 15 + 25 | 480 | 15 | 1500 | 183000 |

The above disclosed exemplary embodiments may be used to obtain InP-based heterostructures that are free of mobile electrons (created at interface donor states) that are used for the fabrication of waveguide-integrated optoelectronic devices. As known in the art, electrons in the InP cladding layer of the waveguide-integrated optoelectronic devices can pool into the narrower band-gap material. Therefore by using As-based nucleation layer and/or hydrogen cleaning as disclosed above it may be possible eliminate charge at InP interfaces in order to minimize free carrier absorption in the lower band-gap waveguide material. Similarly, the above disclosed exemplary embodiments may be also used to fabricate high speed photodiodes.

Use of the As-based nucleation layer and/or hydrogen cleaning to reduce interface charge between layers may be applied in the field of quantum computing using InP-based heterostructures. The InP-based heterostructures in quantum computing rely on confining charge in 2D electron gas structures. By using the As-based nucleation layer and/or hydrogen cleaning it may be possible to reduce a parallel conduction path such as a conductive interface layer to improve the performance of the InP-based heterostructures.

Electronic Devices with Reduced Interface Charge Between Epitaxially Grown Layers FIG. 4 is a cross sectional view of a Double Heterojunction bipolar transistor (DHBT) 30 with a Selectively Implanted Buried Sub-collector (SIBS) 330.

Figure 5:
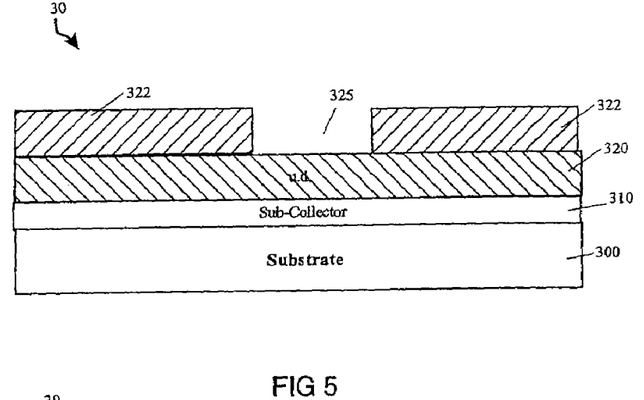
FIGS. 5-7 depict a process of forming the DHBT of FIG. 4 according to the present disclosure.
Figure 6:
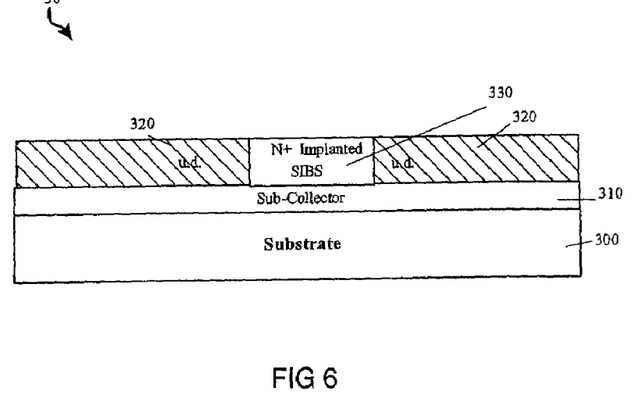
Figure 7:
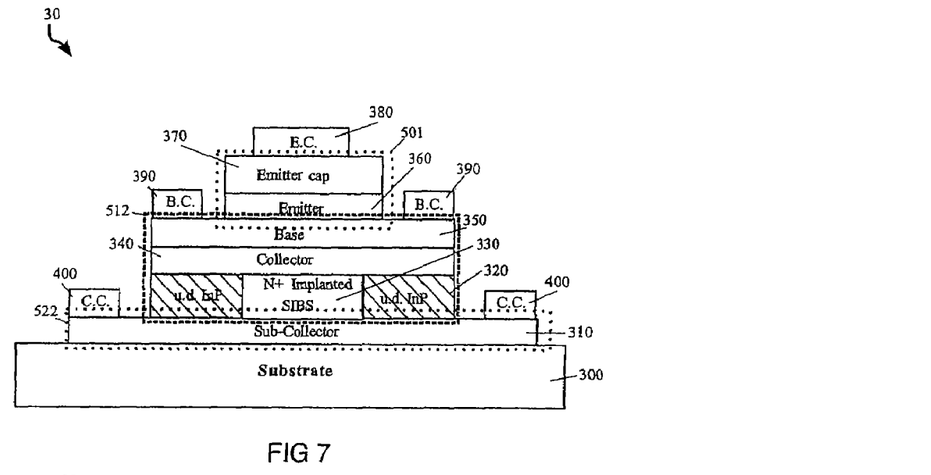

The DHBT 30 with SIBS 330 as shown in FIG. 4 is a high performance DHBT with reduced extrinsic base-collector In one exemplary embodiment, the DHBT 30 may be formed by: 1) depositing a sub-collector layer 310 of thickness of about 3000 Å on a substrate 300, as shown in FIG. 5; 2) depositing an un-doped layer 320 of thickness of about 2000 Å on the sub-collector layer 310, as shown in FIG. 5; 3) forming an implant mask 322 on the un-doped layer 320 with an opening 325 for an ion implantation of Si into the exposed portion of the un-doped layer 320, as shown in FIG. 5; 4) performing an N+ ion implant of SIBS 330 into the un-doped layer 320 through the opening 325 (ion implantation of SIBS 330 can be of 5E18/cm$^3$ Si concentration near the top of the SIBS 330) and removing the implant mask 322, as shown in FIG. 5; 5) annealing the structure in FIG. 6 for implant activation and damage removal; 6) forming a collector layer 340 of thickness of about 1100 Å on the SIBS 330 and on the un-doped portions 320, as shown in FIG. 7; 7) forming a base layer 350 of thickness of about 350 Å on the collector layer 340, as shown in FIG. 7; 8) forming an emitter layer 360 of thickness of about 500 Å on the base layer 350, as shown in FIG. 7; 9) forming an emitter cap layer 370 of thickness of about 1150 Å on the emitter layer 360, as shown in FIG. 7; 10) forming an emitter contact 380 on the emitter cap layer 370 and an emitter mesa 501, as shown in FIG. 7; 11) forming base contacts 390 on the base layer 350 and a base mesa 512, as shown in FIG. 7; and 12) forming collector contacts 400 on the sub-collector layer 310 and an isolation mesa 522, as shown in FIG. 7.

As shown in FIG. 7, the emitter mesa 501 contains the emitter cap layer 370 and the emitter layer 360; the base mesa 512 contains the base layer 350, collector layer 340, un-doped layer 320 and SIBS 330; and the isolation mesa 522 contains the sub-collector layer 310.

Figure 8:
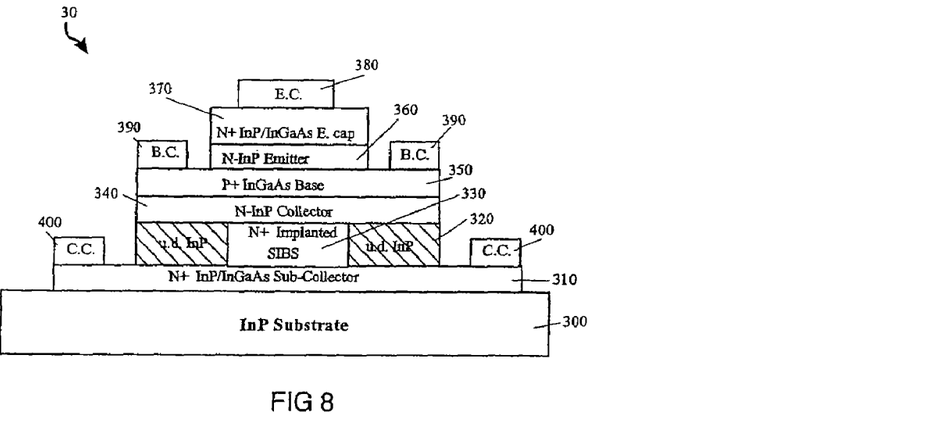
FIG. 8 depicts the DHBT of FIG. 4 formed on an InP substrate according to the present disclosure.

As shown in FIG. 8, in one exemplary embodiment, the DHBT 30's layer may contain the following materials. The substrate 300 may, for example, contain InP material. The sub-collector layer 310 may, for example, contain N+InP/InGaAs material. The un-doped layer 320 may, for example, contain InP material. The collector layer 340 may, for example, contain N−InP material. The base layer 350 may, for example, contain P+InGaAs or P+GaAsSb materials. The emitter layer 360 may, for example, contain N−InP material. The emitter cap layer 370 may, for example, contain N+InP/InGaAs material. The emitter contact 380 may, for example, contain Ti/Pt/Au, AuGe or AuGe/Ni/Au materials. The base contacts 390 may, for example, contain Ti/Pt/Au or Pt/Ti/Pt/Au materials. The collector contacts 400 may, for example, contain AuGe or AuGe/Ni/Au materials.

To un-block electron transport between the P+InGaAs base layer 350 and the N−InP collector layer 340 a graded layer structure (not shown for clarity reasons) may be used as known in the art.

Figure 9:
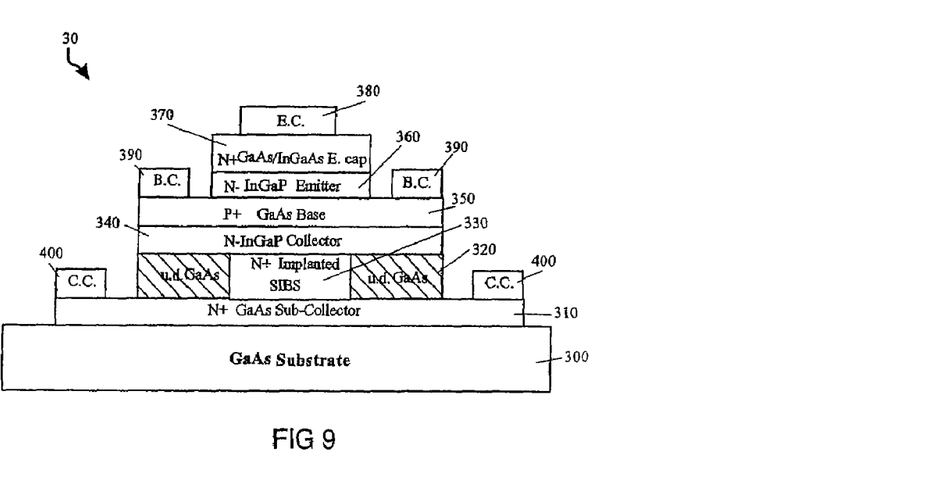
FIG. 9 depicts the DHBT of FIG. 4 formed on a GaAs substrate according to the present disclosure.

As shown in FIG. 9, in one exemplary embodiment, the DHBT 30's layer may contain the following materials. The substrate 300 may, for example, contain GaAs material. The sub-collector layer 310 may, for example, contain N+GaAs material. The un-doped layer 320 may, for example, contain GaAs material. The collector layer 340 may, for example, contain InGaP material. The base layer 350 may, for example, contain P+GaAs material. The emitter layer 360 may, for example, contain N−InGaP material. The emitter cap layer 370 may, for example, contain N+GaAs/InGaAs material. The emitter contact 380 may, for example, contain Ti/Pt/Au, AuGe or AuGe/Ni/Au materials. The base contacts 390 may, for example, contain Ti/Pt/Au or Pt/Ti/Pt/Au materials. The collector contacts 400 may, for example, contain AuGe or AuGe/Ni/Au materials.

The DHBT 30 shown in FIG. 9 may also contain a spacer layer (not shown) composed of, for example, N−GaAs material, between the collector layer 340 and the base layer 350. The DHBT 30 shown in FIG. 9 may further contain an N-doping spike layer (not shown) between the spacer layer (not shown) and the collector layer 340. The spacer layer (not shown) and the N-doping spike layer (not shown) may be used to ease electron transport from the base layer 350 to the collector layer 340 shown in FIG. 9.

Any of the ways described above for reducing an interface charge built up may be used to reduce interface charge built up between the InP collector layer 340 and the un-doped InP layers 320 shown in FIG. 8. As described above, in one embodiment, an interface charge between the InP collector layer 340 and the un-doped InP layers 320 may be reduced by forming an As-based nucleation layer of thickness of about 10 Å to 1000 Å (not shown) between the InP collector layer 340 and the un-doped InP layers 320.

As described above, in another embodiment, an interface charge between the InP collector layer 340 and the un-doped InP layers 320 may also be reduced by performing an ex-situ cleaning with HF containing solution on the un-doped InP layer 320 and growing an As-based nucleation layer (not shown), of thickness of about 10 Å to 1000 Å, between the ex-situ HF treated un-doped InP layer 320 and the InP collector layer 340.

As described above, in another embodiment, an interface charge between the InP collector layer 340 and the un-doped InP layers 320 may be reduced by performing an in-situ cleaning with reactive hydrogen of the un-doped InP layers 320 prior to forming the InP collector layer 340 on the un-doped InP layers 320.

Further, as know in the art, in another embodiment, an interface charge between the InP collector layer 340 and the un-doped InP layers 320 may also be reduced by a P-type counter doping like, for example, Beryllium (Be) doping.

The SIBS DHBTs 30 described above in FIGS. 9 and 10 may be used in an Optoelectronic Integrated circuit (OEIC). Besides the DHBT 30, the OEIC 35 may include devices such as for example a pin photo diode 40, as shown in a cross sectional view in FIGS. 10 and 11. The base contacts of the DHBT 30 may be electrically connected (not shown) to either pin photo diode 40's p contact 520 or pin photo diode 40's n contact 510 in order to convert the current generated by the pin photo diode 40 into the voltage for further processing (not shown).

Typically, trade off of performance of a pin photo diode and SHBT occurs when both a photo absorbing layer of a pin photo diode and a collector layer of a SHBT have same doping and thickness. To improve the performance of the OEIC containing a pin photo diode and a DHBT for Ultra wideband applications of 40+ Gb/s and beyond, the embodiments of OEIC 35 disclosed in the present disclosure provide pin photo diode 40 that is disposed on a layer stack 42 composed of the same layers as the adjacent DHBT 30, as shown in FIGS. 10 and 11.

According to the present disclosure it is possible to provide the pin photo diode 40 with a thicker absorption layer 490 that enhances sensitivity and responsivity of the pin photo diode 40.

Figure 10:
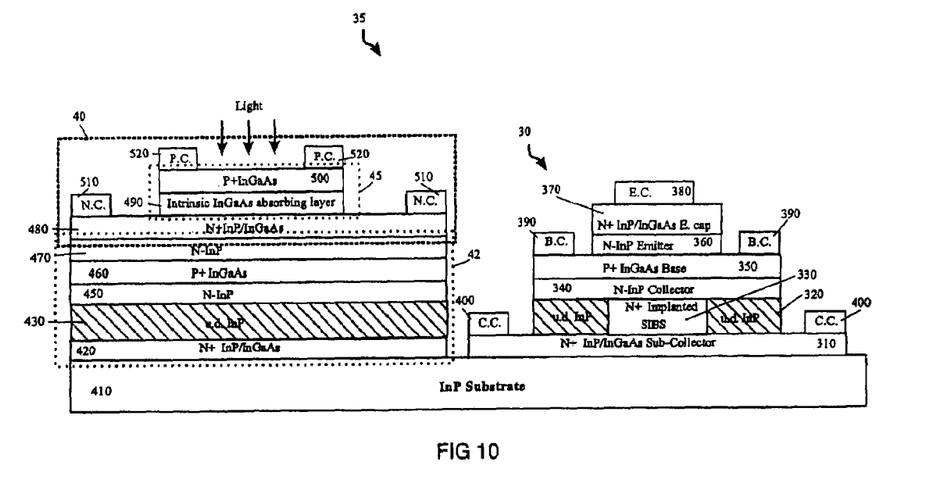
FIG. 10 depicts an Optoelectronic Integrated circuit formed on an InP substrate according to the present disclosure.
Figure 11:
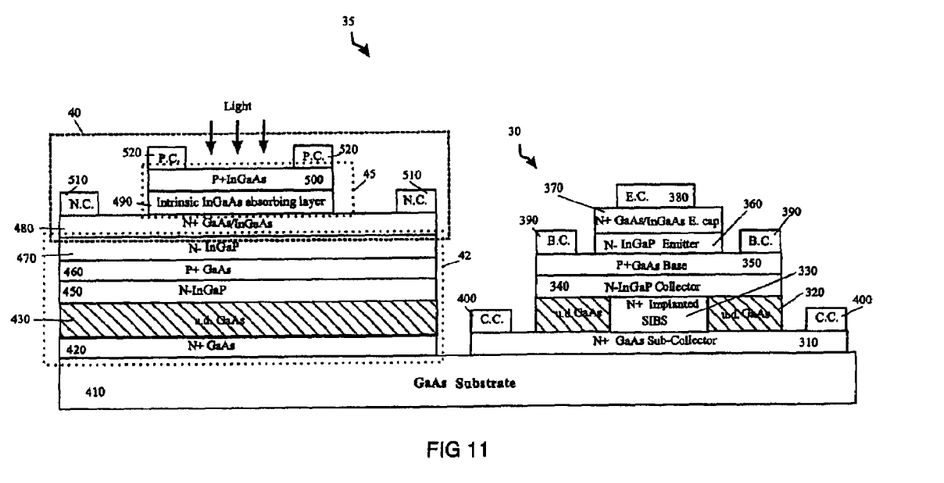
FIG. 11 depicts an Optoelectronic Integrated circuit formed on a GaAs substrate according to the present disclosure.

As shown in FIGS. 10 and 11, layer 420 of the layer stack 42 contains the same material as the sub-collector layer 310 of the DHBT 30. Similarly, layer stack 42's layer 430 is the same as DHBT 30's un-doped layer 320; layer stack 42's layer 450 is the same as DHBT 30's collector layer 340; layer stack 42's layer 460 is the same as DHBT 30's base layer 350; layer stack 42's layer 470 is the same as DHBT 30's emitter layer 360; and pin photo diode 40's layer 480 is the same as DHBT 30's emitter cap layer 370.

The only difference between the pin photo diode 40 that is disposed on a layer stack 42 and the DHBT 30 are the two layers 490 and 500 that are disposed on pin photo diode 40's layer 480, as shown in FIGS. 10 and 11.

In one exemplary embodiment, the OEIC 35 may be formed by: 1) depositing a N+InP/InGaAs material of thickness of about 3000 Å on an InP substrate 410 to form a sub-collector layer 310 and layer 420, as shown in FIG. 10; 2) depositing an un-doped InP material of thickness of about 2000 Å on the sub-collector layer 310 and layer 420 to form an un-doped layer 320 and an un-doped layer 430, as shown in FIG. 10; 3) forming an implant mask (not shown) on the un-doped layer 320 with an opening (not shown) for an ion implantation of Si into the exposed portion of the un-doped layer 320; 4) performing an N+ ion implant of SIBS 330 shown in FIG. 10 into the un-doped layer 320 through the opening (not shown) (ion implantation of SIBS 330 can be of 5E18/cm$^3$ Si concentration near the top of the SIBS 330) and removing the implant mask (not shown); 5) annealing the SIBS 330 for implant activation and damage removal; 6) depositing an N-IP material of thickness of about 1100 Å on the SIBS 330, on the un-doped portions 320 and on the un-doped layer 430 to form a collector layer 340 and a layer 450 as shown in FIG. 10; 7) depositing a P+InGaAs material of thickness of about 350 Å on the collector layer 340 and the layer 450 to form a base layer 350 and a layer 460, as shown in FIG. 10; 8) depositing a N−InP material of thickness of about 500 Å on the base layer 350 and on the layer 460 to form an emitter layer 360 and a layer 470, as shown in FIG. 10; 9) depositing a N+InP/InGaAs material of thickness of about 1150 Å on the emitter layer 360 and the layer 470 to form an emitter cap layer 370 and a layer 480, as shown in FIG. 10; 10) depositing intrinsic material of thickness of about 4000 Å on the layer 480 to form an absorbing layer 490, as shown in FIG. 10; 11) depositing a P+InGaAs material doped at $5E18/cm^3$ and of thickness about 400 Å followed by depositing a P+InGaAs material doped at $2E19/cm^3$ and of thickness of about 100 Å to form a layer 500, as shown in FIG. 10; 12) forming p contacts 520 on the layer 500 and a photo diode mesa 45, as shown in FIG. 10; during the photo diode mesa 45 etch exposing emitter cap layer 370 of DHBT 30, as shown in FIG. 10; 13) forming n contacts 510 on the layer 480 and forming an emitter contact 380 on the emitter cap layer 370, as shown in FIG. 10; 14) forming an emitter mesa 501 while patterning layers 480 and 470, as shown in FIGS. 10 and 7; 15) forming base contacts 390 on the base layer 350 and a base mesa 512 while patterning layers 460, 450 and 430, as shown in FIGS. 10 and 7; and 16) forming collector contacts 400 on the sub-collector layer 310 and an isolation mesa 522 while patterning layer 410, as shown in FIGS. 10 and 7.

As shown in FIG. 10, the photo diode mesa 45 contains the layer 500 and the layer 490.

In one exemplary embodiment, the intrinsic material (i.e. semi-insulating material) in the absorbing layer 490, shown in FIG. 10, may contain, for example, InGaAs, $In_xGa_{1-x}Al_{1-x-y}As$, $In_xGa_{1-x}As_yP_{1-y}$, $In_xGa_{1-x}As_{1-y}N_y$, or InGaAsPN materials lattice matched, for example, with InP material in the layer 480, shown in FIG. 10. The InGaAs, $In_xGa_{1-x}Al_{1-x-y}As$, $In_xGa_{1-x}As_yP_{1-y}$, $In_xGa_{1-x}As_{1-y}N_y$, or InGaAsPN materials determine the wavelength of light absorbed by the pin photo diode 40.

The emitter contact 380 may, for example, contain Ti/Pt/Au, AuGe or AuGe/Ni/Au materials. The base contacts 390 and the p contacts 520 may, for example, contain Ti/Pt/Au or Pt/Ti/Pt/Au materials. The collector contacts 400 may, for example, contain AuGe or AuGe/Ni/Au materials. The n contacts 510 may, for example, contain Ti/Pt/Au, AuGe or AuGe/Ni/Au materials.

As known in the art, the series resistance of the emitter cap layer 370 may be reduced by depositing an N+ layer on top of the emitter cap layer 370.

To un-block electron transport between the P+InGaAs base layer 350 and the N–InP collector layer 340 a graded layer structure (not shown for clarity reasons) may be used as known in the art.

Any of the ways described above for reducing an interface charge built up may be used to reduce interface charge built up between the InP collector layer 340 and the un-doped InP layers 320 shown in FIG. 10. As described above, in one embodiment, an interface charge between the InP collector layer 340 and the un-doped InP layers 320 may be reduced by forming an As-based nucleation layer of thickness of about 10 Å to 1000 Å (not shown) between the InP collector layer 340 and the un-doped InP layers 320. For consistency, the As-based nucleation layer may also be formed between the layers 450 and 430.

As described above, in another embodiment, an interface charge between the InP collector layer 340 and the un-doped InP layers 320 may also be reduced by performing an ex-situ cleaning with HF containing solution on the un-doped InP layer 320 and growing an As-based nucleation layer (not shown), of thickness of about 10 Å to 1000 Å, between the ex-situ HF treated un-doped InP layer 320 and the InP collector layer 340. For consistency, the ex-situ cleaning with HF containing solution of the layers 430 and formation of the As-based nucleation layer between the layers 450 and 430 may also be formed.

As described above, in another embodiment, an interface charge between the InP collector layer 340 and the un-doped InP layers 320 may be reduced by performing an in-situ cleaning with reactive hydrogen on the un-doped InP layers 320 prior to forming the InP collector layer 340 on the un-doped InP layers 320. For consistency, the in-situ cleaning with reactive hydrogen of the layers 430 may also be formed.

Further, as know in the art, in another embodiment, an interface charge between the InP collector layer 340 and the un-doped InP layers 320 may also be reduced by a P-type counter doping, for example, Beryllium (Be) doping. For consistency, P-type counter doping may also be performed on the layer 430.

In another exemplary embodiment, the OEIC 35 may be formed by: 1) depositing a N+GaAs material of thickness of about 3000 Å on a GaAs substrate 410 to form a sub-collector layer 310 and layer 420, as shown in FIG. 11; 2) depositing an un-doped GaAs material of thickness of about 2000 Å on the sub-collector layer 310 and layer 420 to form an un-doped layer 320 and an un-doped layer 430, as shown in FIG. 11; 3) forming an implant mask (not shown) on the un-doped layer 320 with an opening (not shown) for an ion implantation of Si into the exposed portion of the un-doped layer 320; 4) performing an N+ ion implant of SIBS 330 shown in FIG. 11 into the un-doped layer 320 through the opening (not shown) (ion implantation of SIBS 330 can be of $5E18/cm^3$ Si concentration near the top of the SIBS 330) and removing the implant mask (not shown); 5) annealing the SIBS 330 for implant activation and damage removal; 6) depositing an N–InGaP material of thickness of about 1100 Å on the SIBS 330, on the un-doped portions 320 and on the un-doped layer 430 to form a collector layer 340 and a layer 450 as shown in FIG. 11; 7) depositing a P+GaAs material of thickness of about 350 Å on the collector layer 340 and the layer 450 to form a base layer 350 and a layer 460, as shown in FIG. 11; 8) depositing a N–InGaP material of thickness of about 500 Å on the base layer 350 and on the layer 460 to form an emitter layer 360 and a layer 470, as shown in FIG. 11; 9) depositing a N+GaAs/InGaAs material of thickness of about 1150 Å on the emitter layer 360 and the layer 470 to form an emitter cap layer 370 and a layer 480, as shown in FIG. 11; 10) depositing intrinsic material of thickness of about 4000 Å on the layer 480 to form an absorbing layer 490, as shown in FIG. 11; 11) depositing a P+InGaAs material doped at $5E18/cm^3$ and of thickness about 400 Å followed by depositing a P+InGaAs material doped at $2E19/cm^3$ and of thickness of about 100 Å to form a layer 500, as shown in FIG. 11; 12) forming p contacts 520 on the layer 500 and a photo diode mesa 45, as shown in FIG. 11; during the photo diode mesa 45 etch exposing emitter cap layer 370 of DHBT 30, as shown in FIG. 11; 13) forming n contacts 510 on the layer 480 and forming an emitter contact 380 on the emitter cap layer 370, as shown in FIG. 11; 14) forming an emitter mesa 501 while patterning layers 480 and 470, as shown in FIGS. 11 and 7; 15) forming base contacts 390 on the base layer 350 and a base mesa 512 while patterning layers 460, 450 and 430, as shown in FIGS. 11 and 7; and 16) forming collector contacts 400 on the sub-collector layer 310 and an isolation mesa 522 while patterning layer 410, as shown in FIGS. 11 and 7.

As shown in FIG. 11, the photo diode mesa 45 contains the layer 500 and the layer 490.

In one exemplary embodiment, the intrinsic material (i.e. semi-insulating material) in the absorbing layer 490, shown in FIG. 11, may contain, for example, InGaAs, $In_xGa_{1-x}$ $Al_{1-x-y}As$, $In_xGa_{1-x}As_yP_{1-y}$, $In_xGa_{1-x}As_{1-y}N_y$, or InGaAsPN materials lattice matched, for example, with GaAs material in the layer 480, shown in FIG. 11. The InGaAs, $In_xGa_{1-x}Al_{1-x-y}As$, $In_xGa_{1-x}As_yP_{1-y}$, $In_xGa_{1-x}As_{1-y}N_y$, or InGaAsPN materials determine the wavelength of light absorbed by the pin photo diode 40.

The emitter contact 380 may, for example, contain Ti/Pt/Au, AuGe or AuGe/Ni/Au materials. The base contacts 390 and the p contacts 520 may, for example, contain Ti/Pt/Au or Pt/Ti/Pt/Au materials. The collector contacts 400 may, for example, contain AuGe or AuGe/Ni/Au materials. The n contacts 510 may, for example, contain Ti/Pt/Au, AuGe or AuGe/Ni/Au materials.

The DHBT 30 shown in FIG. 11 may also contain a spacer layer (not shown) composed of, for example, N−GaAs material, between the collector layer 340 and the base layer 350. For consistency, the spacer layer (not shown) may also be formed between the layers 450 and 460.

The DHBT 30 shown in FIG. 11 may further contain an N-doping spike layer (not shown) between the spacer layer (not shown) and the collector layer 340. For consistency, N-doping spike layer (not shown) may also be formed on the layer 450.

The foregoing detailed description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "step(s) for . . . ."

What is claimed is:

1. A method for reducing interface charge between epitaxially grown layers, the method comprising:
   selecting a first InP layer;
   performing an in-situ cleaning with reactive hydrogen of the first InP layer, wherein reactive hydrogen is created by thermal decomposition, electron bombardment or radio frequency (RF) plasma assisted decomposition of hydrogen; and
   epitaxially growing a second InP layer on the first InP layer.

2. A Heterojunction bipolar transistor (HBT) comprising:
   a substrate;
   a sub-collector supported by the substrate;
   an un-doped layer having a selectively implanted buried sub-collector and supported by the sub-collector;
   an As-based nucleation layer partially supported by the un-doped layer;
   a collector layer supported by the As-based nucleation layer;
   a base layer supported by the collector layer;
   an emitter layer and a base contact supported by the base layer;
   an emitter cap layer supported by the emitter layer;
   an emitter contact supported by the emitter cap layer; and
   a collector contact supported by the sub-collector.

3. The HBT of claim 2, wherein the un-doped layer having the selectively implanted buried sub-collector has been ex-situ cleaned with hydrogen fluoride (HF) solution.

4. The HBT of claim 3, wherein the HF solution is Buffer Oxide Etch (BOE).

5. The HBT of claim 2, wherein the As-based nucleation layer comprises substantially InGaAlAs, InGaAs, InAlAs, InGaAsP, GaAlAs, InAs, GaAs or AlAs.

6. A device comprising the HBT of claim 2 and a pin photo diode supported by a plurality of layers.

7. The device of claim 6, wherein the plurality of layers comprises:
   a first layer supported by the substrate and having the same material as the sub-collector;
   a second layer supported by the first layer and having the same material as the un-doped layer;
   a third layer supported by the second layer and having the same material as the As-based nucleation layer;
   a fourth layer supported by the third layer and having the same material as the collector layer;
   a fifth layer supported by the fourth layer and having the same material as the base layer; and
   a sixth layer supported by the fifth layer and having the same material as the emitter layer.

8. The device of claim 6, wherein the pin photo diode comprises:
   a first diode layer supported by the sixth layer and having the same material as the emitter cap layer;
   an absorbing layer supported by the first diode layer; and
   a second diode layer supported by the absorbing layer.

9. The device of claim 8, wherein the pin photo diode further comprises:
   a p contact disposed on the second diode layer; and
   an n contact disposed on the first diode layer.

10. The device of claim 9, wherein the base contact is electrically connected to the n contact or the p contact.

11. The device of claim 6, wherein the un-doped layer having the selectively implanted buried sub-collector has been ex-situ cleaned with a solution containing hydrogen fluoride (HF).

12. The device of claim 11, wherein the solution containing HF is Buffer Oxide Etch (BOE).

13. The device of claim 6, wherein the As-based nucleation layer comprises substantially InGaAlAs, InGaAs, InAlAs, InGaAsP, GaAlAs, InAs, GaAs or AlAs.

14. A method for forming a Heterojunction bipolar transistor (HBT), the method comprising:
   selecting a substrate;
   forming a sub-collector on the substrate;
   forming an un-doped layer on the sub-collector;
   performing ion implantation of Si on a portion of the un-doped layer;
   annealing the ion implanted un-doped layer for implant activation and damage removal;

performing an in-situ cleaning with reactive hydrogen of the un-doped layer, wherein reactive hydrogen is created by thermal decomposition, electron bombardment or radio frequency (RF) plasma assisted decomposition of hydrogen;

forming a collector layer on the ion implanted un-doped layer so that the in-situ cleaning with reactive hydrogen reduces interface charge between the un-doped layer and the collector layer;

forming a base layer on the collector layer;

forming an emitter layer on the base layer;

forming an emitter cap layer on the emitter layer;

forming an emitter contact on the emitter cap layer;

forming a base contact on the base layer; and forming a collector contact on the sub-collector.

\* \* \* \* \*